United States Patent
Grannen et al.

(10) Patent No.: US 9,608,589 B2
(45) Date of Patent: Mar. 28, 2017

(54) METHOD OF FORMING ACOUSTIC RESONATOR USING INTERVENING SEED LAYER

(75) Inventors: Kevin J. Grannen, Thornton, CO (US); Chris Feng, Fort Collins, CO (US); Phil Nikkel, Loveland, CO (US); John Choy, Westminster, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 962 days.

(21) Appl. No.: 12/911,986

(22) Filed: Oct. 26, 2010

(65) Prior Publication Data

US 2012/0096697 A1    Apr. 26, 2012

(51) Int. Cl.
| H03H 3/02 | (2006.01) |
| H01L 41/314 | (2013.01) |
| H01L 41/317 | (2013.01) |
| H03H 9/17 | (2006.01) |

(52) U.S. Cl.
CPC ............ H03H 3/02 (2013.01); H01L 41/314 (2013.01); H01L 41/317 (2013.01); H03H 9/173 (2013.01); H03H 9/175 (2013.01); H03H 2003/021 (2013.01); H03H 2003/025 (2013.01); Y10T 29/42 (2015.01)

(58) Field of Classification Search
CPC .......... H03H 3/02; H03H 9/173; H03H 9/175; H03H 2003/021; H03H 2003/025; H01L 41/314; H01L 41/317; Y10T 29/42
USPC ...... 29/25.35, 842, 846, 594; 427/98.5, 100, 427/301; 438/75; 331/107 A; 335/78; 333/189

See application file for complete search history.

(56) References Cited

U.S. PATENT DOCUMENTS

| 3,363,119 A | 1/1968 | Koneval et al, |
| 3,365,591 A | 1/1968 | Curran et al. |
| 3,401,276 A | 9/1968 | Curran et al. |
| 5,355,568 A * | 10/1994 | Imai et al. ................... 29/25.35 |
| 5,454,146 A * | 10/1995 | Yagi et al. ................... 29/25.35 |
| 5,587,620 A | 12/1996 | Ruby et al. |
| 5,736,430 A | 4/1998 | Seefeldt et al. |
| 5,873,153 A | 2/1999 | Ruby et al. |
| 6,320,239 B1 | 11/2001 | Eccardt et al. |
| 6,384,697 B1 | 5/2002 | Ruby |
| 6,420,202 B1 | 7/2002 | Barber et al. |
| 6,507,983 B1 | 1/2003 | Ruby et al. |
| 6,803,843 B2 * | 10/2004 | Kato et al. ...................... 335/78 |
| 6,812,619 B1 | 11/2004 | Kaitila et al. |
| 6,828,713 B2 | 12/2004 | Bradley et al. |

(Continued)

FOREIGN PATENT DOCUMENTS

| JP | 53003789 A * | 1/1978 |
| JP | 2002047099 A * | 2/2002 |
| WO | WO-2005008889 | 1/2005 |

OTHER PUBLICATIONS

Co-pending U.S. Appl. No. 12/495,443, filed Jun. 30, 2009.

Primary Examiner — A. Dexter Tugbang

(57) ABSTRACT

A method of forming an acoustic resonator includes forming a seed layer on a first electrode layer, forming a piezoelectric layer directly on a surface of the seed layer, and forming a second electrode layer on the piezoelectric layer. The piezoelectric layer includes multiple crystals of piezoelectric material, and the seed layer causes crystal axis orientations of the crystals to be substantially perpendicular to the surface of the seed layer.

15 Claims, 14 Drawing Sheets

(56) References Cited

U.S. PATENT DOCUMENTS

| | | |
|---|---|---|
| 6,927,651 B2 * | 8/2005 | Larson et al. ............... 333/189 |
| 6,933,809 B2 | 8/2005 | Kyoung et al. |
| 6,984,918 B1 | 1/2006 | Hachigo et al. |
| 6,987,433 B2 * | 1/2006 | Larson et al. ........... 29/25.35 X |
| 7,179,675 B2 * | 2/2007 | Shim .............................. 438/75 |
| 7,187,240 B2 * | 3/2007 | Cathelin et al. ...... 331/107 A X |
| 7,240,409 B2 * | 7/2007 | Sumi et al. ............. Y10T 29/42 |
| 7,275,292 B2 | 10/2007 | Ruby et al. |
| 7,276,836 B2 | 10/2007 | Umeda et al. |
| 7,323,805 B2 | 1/2008 | Sano et al. |
| 7,323,953 B2 | 1/2008 | Yokoyama et al. |
| 7,345,410 B2 | 3/2008 | Grannen et al. |
| 7,358,831 B2 | 4/2008 | Larson, III et al. |
| 7,482,737 B2 | 1/2009 | Yamada et al. |
| 7,489,067 B2 | 2/2009 | Metzger et al. |
| 7,597,757 B2 | 10/2009 | Conley, Jr. et al. |
| 2002/0121840 A1 | 9/2002 | Larson et al. |
| 2004/0256948 A1 * | 12/2004 | Solberg ................ H01L 41/317 |
| 2005/0140247 A1 | 6/2005 | Lee |
| 2006/0103492 A1 | 5/2006 | Feng et al. |
| 2007/0205850 A1 | 9/2007 | Jamneala et al. |
| 2008/0122317 A1 | 5/2008 | Fazzio et al. |
| 2008/0122320 A1 | 5/2008 | Fazzio et al. |
| 2008/0157629 A1 | 7/2008 | Noguchi et al. |
| 2008/0192963 A1 | 8/2008 | Sato |
| 2008/0258842 A1 | 10/2008 | Ruby et al. |
| 2008/0292888 A1 | 11/2008 | Hucker et al. |
| 2009/0045703 A1 | 2/2009 | Barber et al. |
| 2009/0045704 A1 * | 2/2009 | Barber et al. ........... Y10T 29/42 |
| 2009/0212667 A1 * | 8/2009 | Matsushita .............. 29/25.35 X |

\* cited by examiner

METHOD OF FORMING ACOUSTIC RESONATOR USING INTERVENING SEED LAYER

BACKGROUND

Transducers generally convert electrical signals to mechanical signals or vibrations, and/or mechanical signals or vibrations to electrical signals. Acoustic transducers, in particular, convert electrical signals to acoustic signals (sound waves) in a transmit mode (e.g., a speaker application), and/or convert received acoustic waves to electrical signals in a receive mode (e.g., a microphone application). Transducers are used in a wide variety of electronic applications. For example, transducers may be included in film bulk acoustic resonators (FBARs), surface acoustic wave (SAW) resonators or bulk acoustic wave (BAW) resonators used in portable communication devices, such as cellular telephones, personal digital assistants (PDAs), electronic gaming devices, laptop computers and the like. Generally, various types of transducers include an acoustic resonator stack, having a layer of piezoelectric material between two conductive plates (electrodes), which may be formed on a thin membrane.

FIG. 1A is a cross-sectional diagram illustrating an acoustic resonator of a conventional transducer device, which has been formed according to a conventional fabrication process. Referring to FIG. 1A, acoustic resonator 130 is formed by a piezoelectric layer 134 to a first electrode layer 132 is applied to or grown on the first electrode layer 132, and a second electrode layer is applied to the piezoelectric layer 134. The first and second electrode layers 131 and 135 are formed of electrically conductive materials, such as tungsten (W), molybdenum (Mo), and the piezoelectric layer 134 is formed of a thin film of piezoelectrice material, such as zinc oxide (ZnO), aluminum nitride (AlN) or lead zirconium titanate (PZT). The arrows in the piezoelectric layer 134 indicate generally the randomly oriented growth of a ZnO thin film, for example, as discussed below.

More particularly, a ZnO thin film may be deposited with two specific crystal orientations. One crystal orientation is wurtzite (B4) structure consisting of a hexagonal crystal with alternating layers of Zn and oxygen (O) atoms, and the other crystal orientation is a zincblende (B3) structure consisting of a symmetric arrangement of Zn and O atoms. Zincblende structures grow predominantly on cubic substrates. The energetically preferred and more common structure is the wurtzite structure. Due to the nature of the Zn—O bonding in the wurtzite structure, electric field polarization is present in the ZnO crystal, which results in the piezoelectric properties of the ZnO material. To exploit this polarization and the corresponding piezoelectric effect, the ZnO should be synthesized with a specific crystal orientation, discussed below.

FIG. 1B is an expanded view of a representative ZnO crystal in a wurtzite structure. Referring to the orientation shown in FIG. 1B, the a-axis and the b-axis are in the planes of the top and bottom hexagons of the ZnO crystal, while the c-axis is parallel to the sides of the hexagons. For ZnO, the piezoelectric coefficient d33 along the c-axis is about 5.9 pm/$V^2$. In order to take advantage of this piezoelectric coefficient, all of the ZnO crystals need to be oriented in substantially the same direction. If they are not, as shown in FIG. 1A for example, the properties of the ZnO crystals may cancel each other out or achieve a piezoelectric coefficient less than the maximum. Referring again to FIG. 1A, the arrows correspond to the c-axis directions of multiple ZnO crystals. The random mixture of c-axis orientations in the ZnO thin film prevents good piezoelectric response.

SUMMARY

In a representative embodiment, a method of forming an acoustic resonator includes forming a seed layer on a first electrode layer, and forming a piezoelectric layer directly on a surface of the seed layer. The piezoelectric layer includes crystals, such that the seed layer causes crystal axis orientations of the crystals to be substantially perpendicular to the surface of the seed layer. A second electrode layer is formed on the piezoelectric layer.

In another representative embodiment, a method of forming an acoustic transducer device includes forming a first seed layer on a semiconductor substrate, forming a first electrode layer on the first seed layer, forming a second seed layer the first electrode layer, and forming a piezoelectric layer directly on the second seed layer. The piezoelectric layer includes multiple crystals of piezoelectric material, such that the second seed layer causes c-axis orientations of the plurality of crystals to be substantially perpendicular to a top surface of the second seed layer. A second electrode layer is formed on the piezoelectric layer.

In another representative embodiment, a method of forming a film bulk acoustic resonator (FBAR) device includes forming an acoustic mirror on a semiconductor substrate; forming a first seed layer on the acoustic mirror, the first seed layer including AlN and having a thickness of about 10 nm to about 100 nm; forming a first electrode layer on the first seed layer, the first electrode layer including at least one of W and Mo and having a thickness of about 100 nm to about 1000 nm; forming a second seed layer on the first electrode layer, the second seed layer comprising AlN and having a thickness of about 10 nm to about 100 nm; and forming a piezoelectric layer on the second seed layer, the piezoelectric layer including ZnO and having a thickness of about 250 nm to about 1500 nm. The second seed layer causes grains of the ZnO to align substantially perpendicular to a surface of the second seed layer.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1A:
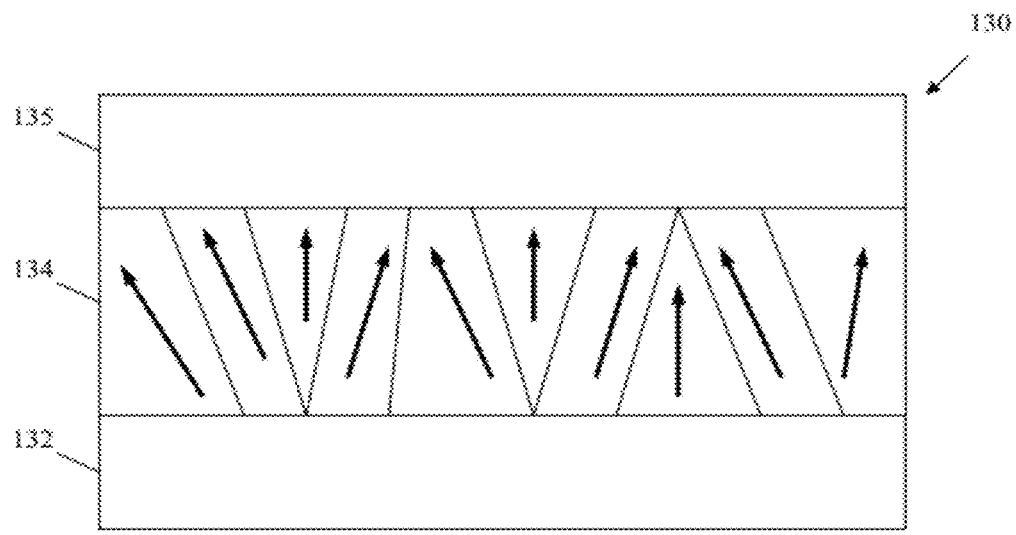
FIG. 1A is a cross-sectional diagram illustrating an acoustic resonator of a conventional transducer device.

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the representative embodiments. Such methods and apparatuses are clearly within the scope of the present teachings.

Generally, it is understood that the drawings and the various elements depicted therein are not drawn to scale. Further, relative terms, such as "above," "below," "top," "bottom," "upper," "lower," "left," "right," "vertical" and "horizontal," are used to describe the various elements' relationships to one another, as illustrated in the accompanying drawings. It is understood that these relative terms are intended to encompass different orientations of the device and/or elements in addition to the orientation depicted in the drawings. For example, if the device were inverted with respect to the view in the drawings, an element described as "above" another element, for example, would now be "below" that element. Likewise, if the device were rotated 90 degrees with respect to the view in the drawings, an element described as "vertical," for example, would now be "horizontal."

According to various embodiments, a transducer device include an acoustic resonator, such as an FBAR, a SAW resonator or a BAW resonator, fabricated by forming a piezoelectric layer directly on an interlayer or seed layer, intervening between the piezoelectric layer and an electrode. For example, an initial or first seed layer may be formed on a substrate, e.g., over a Bragg reflector, a recess or a cavity, a first electrode layer may be formed on the first seed layer, the interlayer or second seed layer may be formed on the first electrode, and a thin piezoelectric layer may be formed (or grown) directly on the top surface of the second seed layer, that is, with no other intervening layers or materials in between. The second seed layer, in particular, causes an improved crystal structure orientation, in which the c-axes of the "crystals" or "grains" of the piezoelectric material are substantially perpendicular to the top surface of the growth surface (e.g., the second seed layer) and are substantially aligned with one another, thereby maximizing the coupling coefficient of the transducer device. The piezoelectric layer thus has a high degree of orientation.

Figure 2:
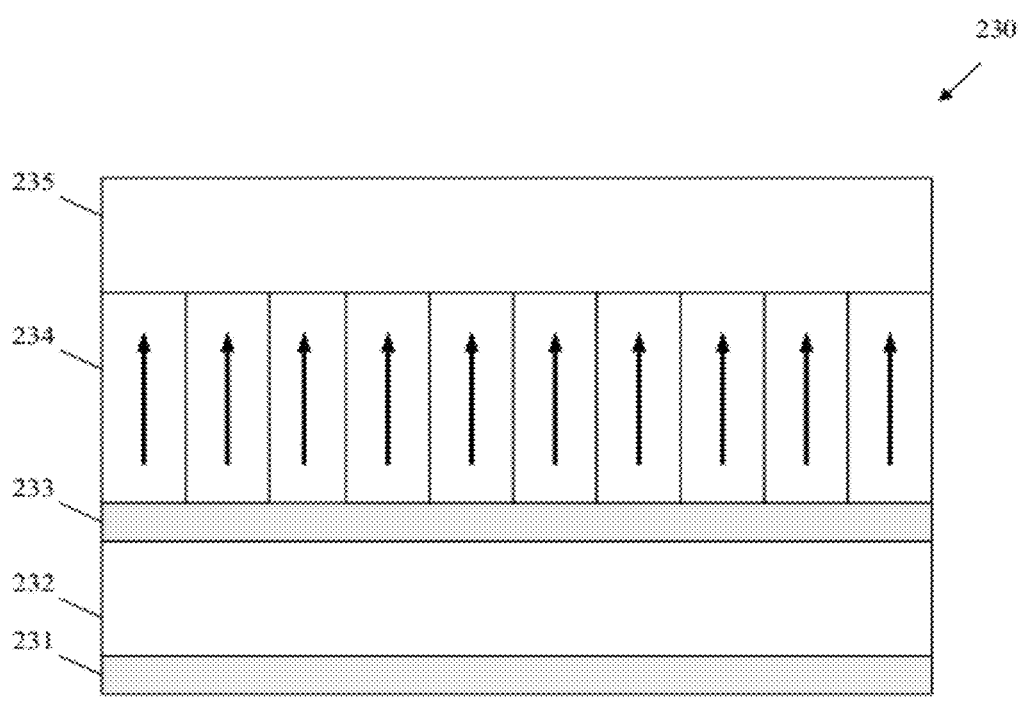
FIG. 2 is a cross-sectional diagram illustrating an acoustic resonator of a transducer device, according to a representative embodiment.

FIG. 2 is a cross-sectional diagram illustrating an acoustic resonator of a transducer device, according to a representative embodiment.

Referring to FIG. 2, acoustic resonator 230 includes first seed layer 231, first electrode layer 232 formed on the first seed layer 231, second seed layer 233 formed on the first electrode layer 232, and piezoelectric layer 234 formed on the second seed layer 233, so that the second seed layer 233 is intervening between the first electrode layer 232 and the piezoelectric layer 234. The second electrode layer 235 is formed on the piezoelectric layer 234 to form the acoustic resonator 230. The arrows in the piezoelectric layer 234 correspond to the c-axis directions of the crystals in the piezoelectric material. The parallel arrangement of the arrows indicate an improved or substantially ideal crystal structure, in which the crystals or grains of the piezoelectric material are aligned substantially perpendicularly, e.g., with respect to the seed layer 233, and are substantially aligned with one another. The acoustic resonator 230 may be included in a transducer device, such as a transmit or receive filter in a duplexer, including one or more FBARs, SAW resonators or BAW resonators, for example. However, it is understood that other types of transducer devices may be incorporated without departing from the scope of the present teachings.

Figure 3:
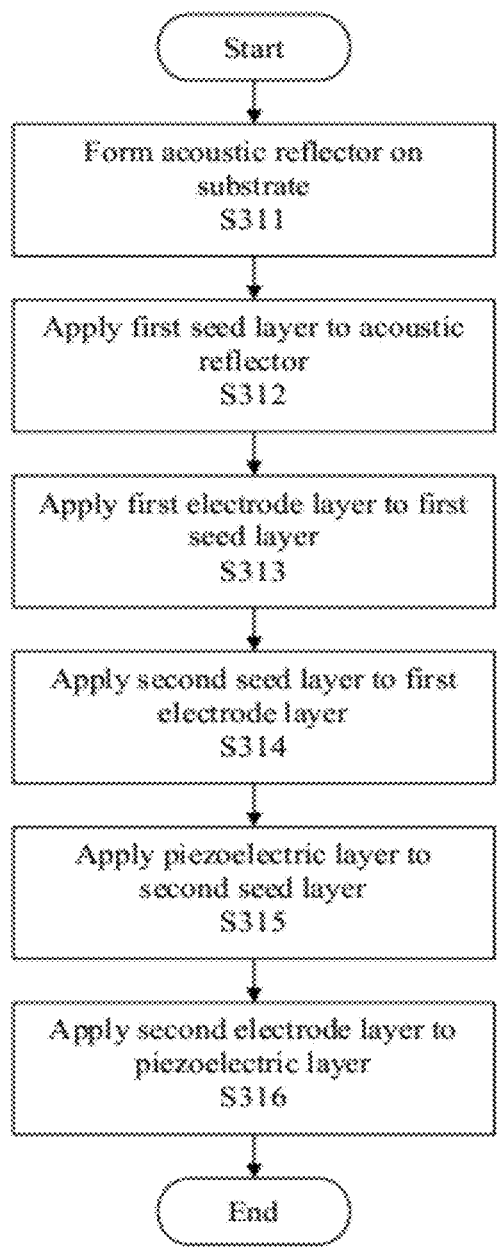
FIG. 3 is a flow diagram illustrating a process of forming a transducer device, according to a representative embodiment.

FIG. 3 is a flow diagram illustrating a method of fabricating a transducer device, according to a representative embodiment. FIGS. 4A-4F are cross-sectional diagrams illustrating the steps of the fabrication process of a transducer device, substantially corresponding to the operations depicted in FIG. 3, according to a representative embodiment. More particularly, FIG. 3 and FIGS. 4A-4F illustrate a method of fabricating transducer device 200 (e.g., shown in FIG. 4F), containing illustrative acoustic resonator 230, discussed above with reference to FIG. 2, according to a representative embodiment.

Figure 4A:
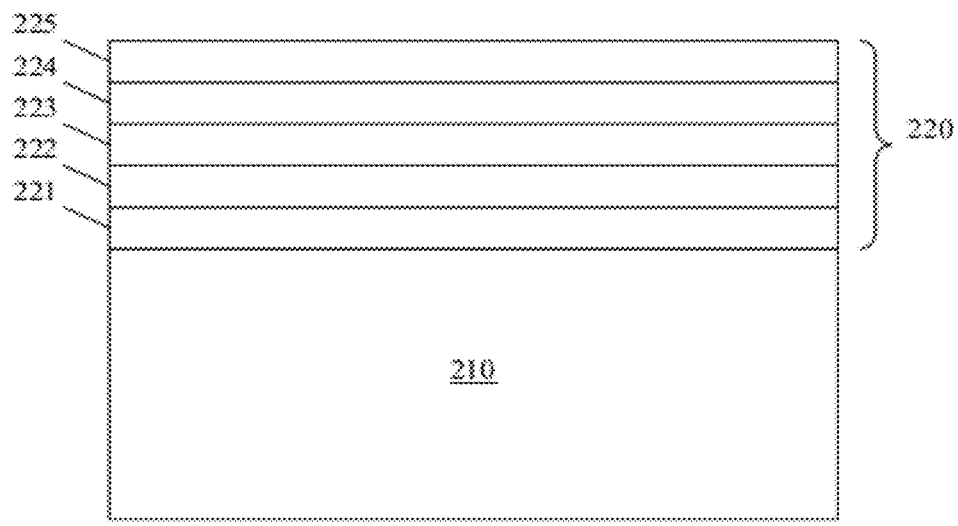
FIGS. 4A-4F are cross-sectional diagrams illustrating steps in a fabrication process of a transducer device, according to a representative embodiment.

In step S311 of FIG. 3, an acoustic mirror or Bragg reflector 220 is formed on a substrate 210, as shown in FIG. 4A, for example, using solidly mounted resonator (SMR) technology. Generally, the Bragg reflector 220 provides high reflectivity with respect to acoustic waves in a predetermined band around the center frequency of the transducer device 200. The substrate 210 may be formed of various materials compatible with semiconductor processes, such as silicon (Si), gallium arsenide (GaAs), indium phosphide (InP), glass, sapphire, alumina, or the like, which is useful for integrating connections and electronics, thus reducing size and cost. In an embodiment, the Bragg reflector 220 is formed of multiple layers 221-225 of alternating high and low acoustic impedance materials. For example, layers 221, 223 and 225 may be formed of high impedance materials, such as W and/or Mo, and intervening layers 222 and 224 may be formed of low impedance materials, such as AlN, silicon dioxide ($SiO_2$) and/or silicon nitride ($Si_3N_4$). The purpose of the Bragg reflector 220 is to isolate the acoustic resonator 230 from the substrate 210.

The layers 221-225 may be applied using a spin-on, sputtering, evaporation or chemical vapor disposition (CVD) technique, for example, although other application techniques may be incorporated. For example, various fabrication techniques of acoustic reflectors are described by LARSON, III, et al. in U.S. Pat. No. 7,358,831, which is hereby incorporated by reference.

In alternative embodiments, there is no Bragg reflector or other acoustic mirror. Rather, a cavity (not shown) may be formed in the top surface of the substrate 210, and the acoustic resonator 230 is positioned over the cavity, as discussed below with reference to FIGS. 7 and 8.

Figure 4B:
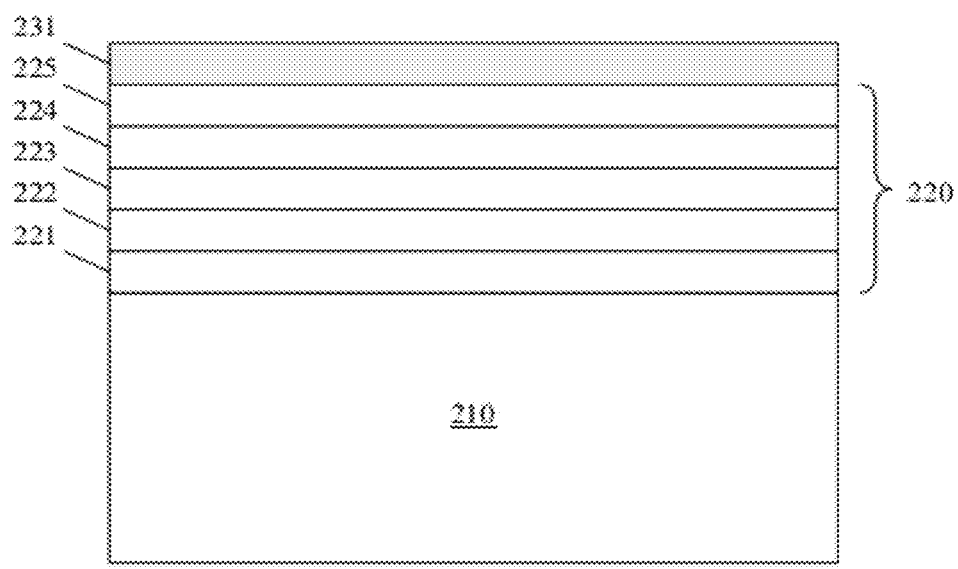

In step S312 of FIG. 3, a first seed layer 231 is formed on the Bragg reflector 220, as shown in FIG. 4B. More particularly, the first seed layer 231 is applied to the top surface of the high acoustic impedance layer 225, using a vacuum technique, such as a sputtering, atomic layer deposition, molecular beam epitaxy (MBE) or evaporation technique, or a non-vacuum technique, such as a sol-gel synthesis, spin coating or polymerization technique, for example, although other application techniques may be incorporated. The first seed layer 231 may be formed of a material that tends to cause crystals in the material of the first electrode layer 232, the piezoelectric layer 234 or both, to become more perpendicularly oriented. For example, the first seed layer 231 may be formed of AlN, $Si_3N_4$, silicon carbide (SiC), or other material compatible with semiconductor processes. The first seed layer 231 is applied to a thickness of about 10 nm (100 Å) to about 100 nm (1000 Å), for example. In alternative embodiments, the first seed layer 231 is not included in the acoustic resonator 230, in which case perpendicular orientation of the piezoelectric layer 234 is influenced by the second seed layer 233 without any assistance from the first seed layer 231, as discussed below.

Figure 4C:
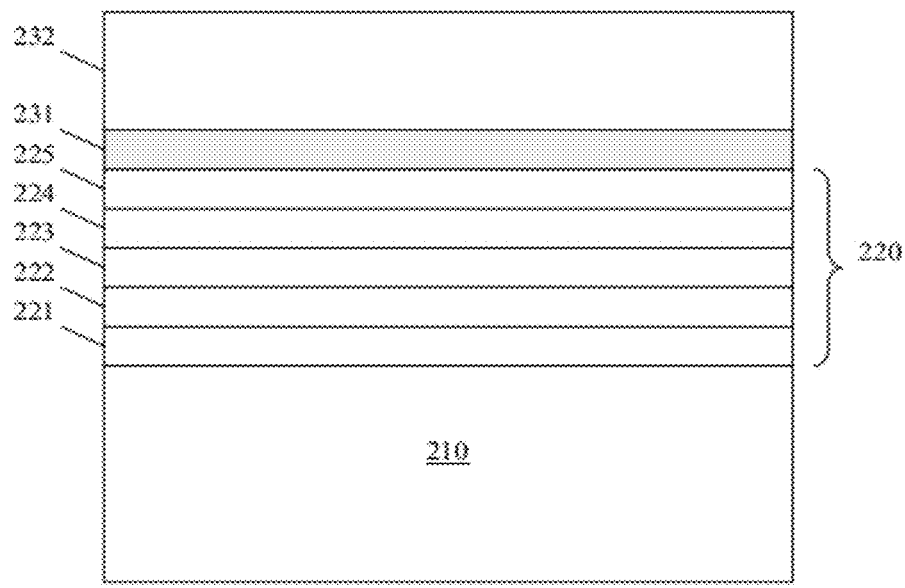

The first electrode layer 232 is applied to the first seed layer 231 in step S313, as shown in FIG. 4C, using a spin-on, sputtering, evaporation or CVD technique, for example, although other application techniques may be incorporated. The first electrode layer 232 is formed of an electrically conductive material, such as W or Mo, for example. The first electrode layer 232 is applied to a thickness of about 100 nm to about 1000 nm, for example.

Figure 1B:
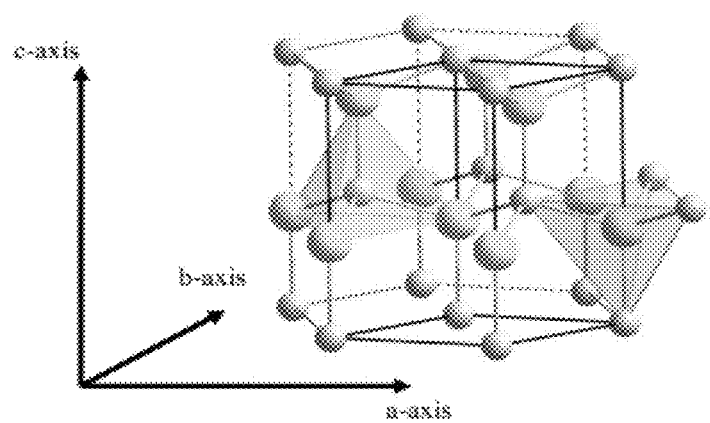
FIG. 1B is an expanded view of a representative zinc oxide (ZnO) crystal in a wurtzite structure.
Figure 4D:
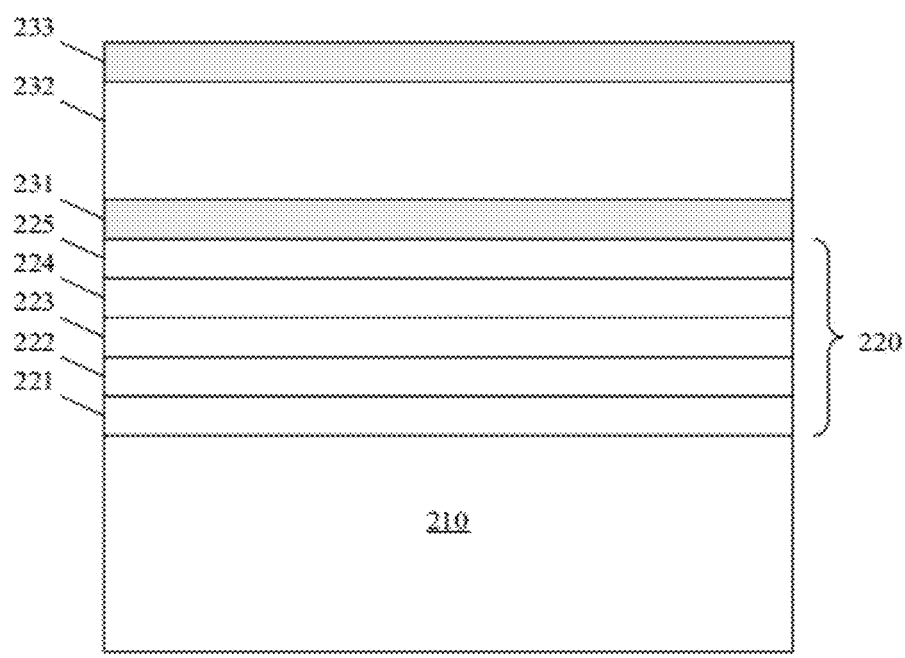

In step S314, the second seed layer 233, also referred to as an interlayer, is formed on the first electrode layer 232, as shown in FIG. 4D. The second seed layer 233 may be applied using a vacuum technique, such as a sputtering, atomic layer deposition, MBE or evaporation technique, or a non-vacuum technique, such as sol-gel synthesis, spin coating or polymerization technique, for example, although other application techniques may be incorporated. The second seed layer 233 is formed of a material that promotes crystal orientation in the piezoelectric material of the piezoelectric, including a metal, a non-metal, ceramic or polymer, an alloy, a compound or element. For example, when the piezoelectric layer 234 is formed of ZnO, the second seed layer 233 may be formed of AlN, which causes the c-axes of the ZnO crystals to be substantially perpendicular to the top surface of the seed layer 233 and substantially aligned with one another, as shown in FIGS. 1B and 2. The second seed layer 233 is applied to a thickness of about 10 nm to about 100 nm, for example, although a particularly high degree of perpendicular orientation of ZnO crystals occurs when the second seed layer 233 is applied to a thickness of about 10 nm to about 30 nm, for example. The second seed layer 233 may be formed of the same or a different material than the first seed layer 231, and may be applied at the same or different thickness as the first seed layer 231.

In an alternative implementation, the second seed layer 233 may be formed of multiple thinner layers, applied sequentially, e.g., using atomic layer deposition. Such a multi-layer second seed layer 233 would have the same overall thickness as a single layer second seed layer 233, discussed above. The layers of a multi-layer second seed layer 233 may be formed from the same material, such as AlN, or alternating layers of different materials, such as AlN and SiC.

The second seed layer 233 further improves the orientation of the piezoelectric material crystals over any improvement in orientation achieved by the first seed layer 231, for example, by causing the c-axes of the piezoelectric material crystals to become more perpendicular with respect to the growth surfaced (e.g., the top surface of the second seed layer 233) than would otherwise have been the case forming only a first seed layer 231. In an alternative embodiment, there is no first seed layer 231 to influence the orientation of the crystals in the piezoelectric layer 234.

Figure 4E:
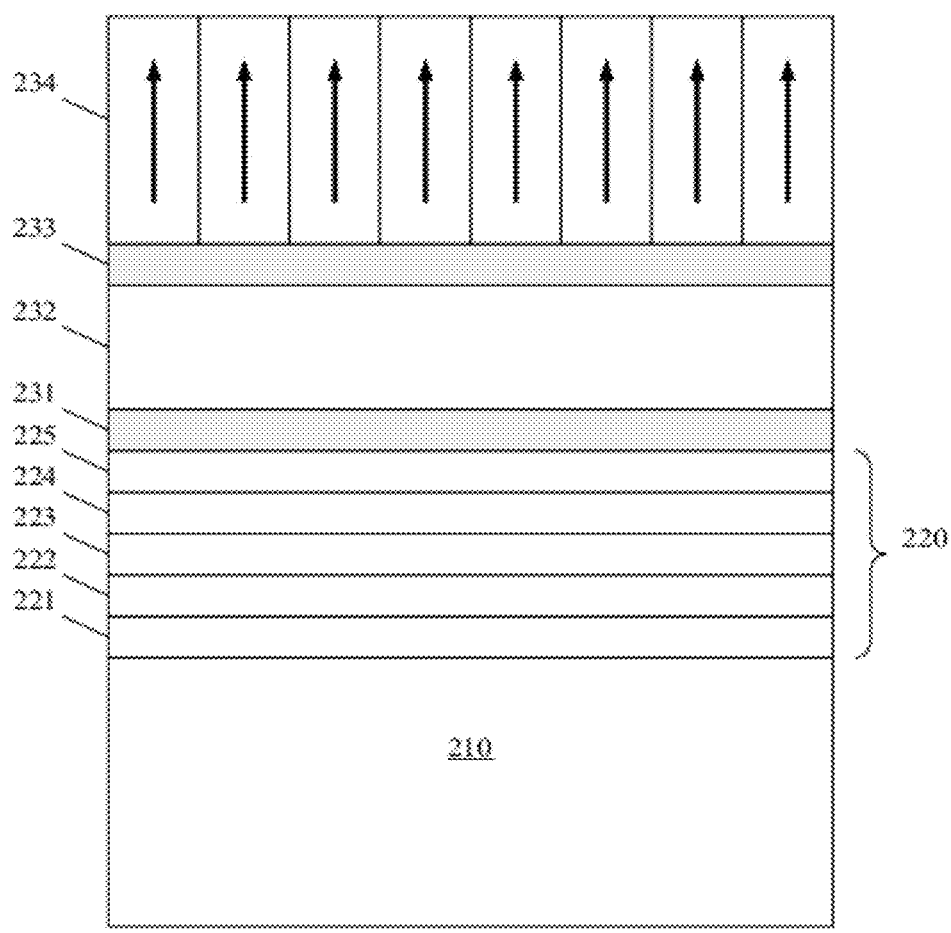

The piezoelectric layer 234 is directly applied to or grown on the second seed layer 233 in step S315, as shown in FIG. 4E. The piezoelectric layer 234 may be applied by sputtering the piezoelectric material on the second seed layer 233, for example. There are no layers or materials intervening between the second seed layer 233 and the piezoelectric layer 234. The piezoelectric layer 234 is formed of a piezoelectric material, such as ZnO, for example, and is grown to a thickness of about 250 nm to about 1500 nm, for example.

Figure 4F:
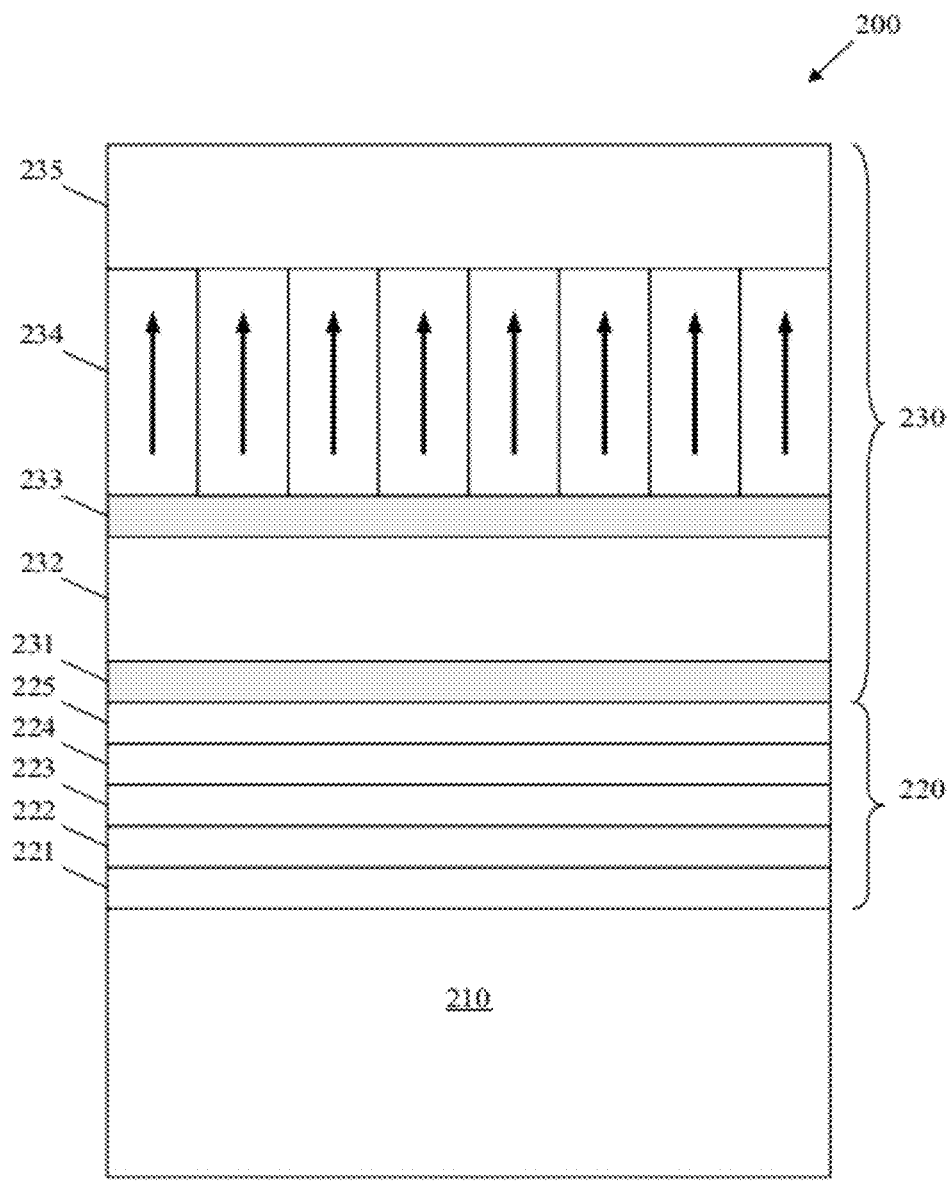

In step S316, the second electrode layer 235 is applied to the piezoelectric layer 234 to provide transducer device 200, as shown in FIG. 4F, using a spin-on, sputtering, evaporation or CVD technique, for example, although other application techniques may be incorporated. The second electrode layer 235 is formed of an electrically conductive material, such as W or Mo, for example, and may be formed of the same or a different material than the first electrode layer 231. The second electrode layer 234 is applied to a thickness of about 100 nm to about 1000 nm, for example. Of course, if the transducer device 200 is formed as part of a wafer, the transducer device 200 may be singulated into a corresponding die following formation of the second electrode layer 235, using any separation technique compatible with semiconductor fabrication processes, such as scribe and break, mechanical or laser sawing, or the like.

As a result of the fabrication process, the transducer device 200 includes piezoelectric layer 234 having a highly uniform orientation of crystals of the piezoelectric material along the c-axis. In other words, the c-axis orientation of the grains is substantially aligned with one another and substantially perpendicular to the growth surface, which is the top surface of the second seed layer 233 in the depicted example. Accordingly, the piezoelectric layer 234 is produced with a high degree of c-axis orientation uniformity in a direction substantially perpendicular to the top surface of the second seed layer 233. By placing the second seed layer 233 on the first electrode 231 substrate before the deposition of the piezoelectric material, the improved c-axis orientation of the piezoelectric layer 234 is enabled.

Figure 5:
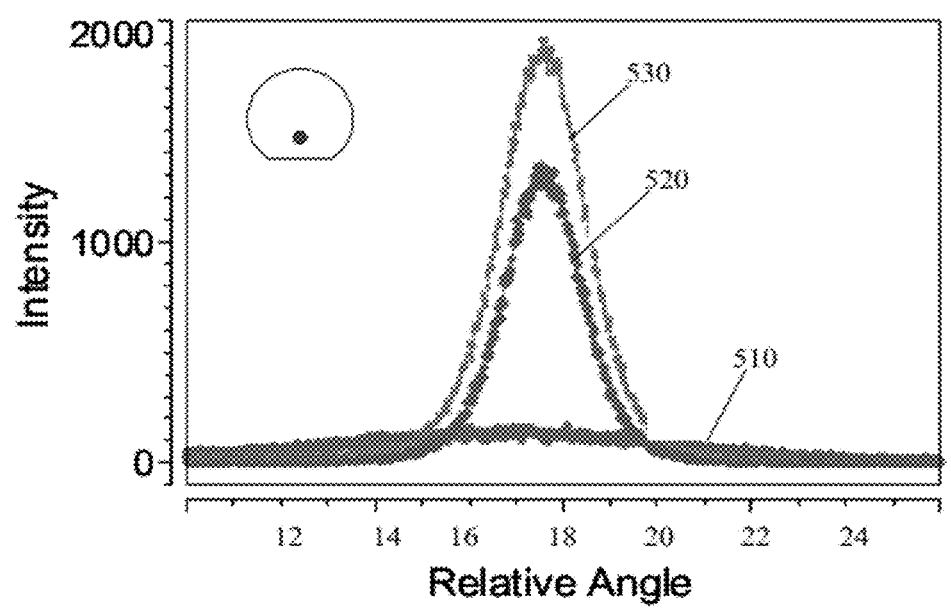
FIG. 5 is a rocking curve analysis comparing performance characteristics of a conventional acoustic resonator and resonators with piezoelectric layers formed directly on intervening seed layers, according to a representative embodiment.

FIG. 5 is a rocking curve analysis comparing performance characteristics of a conventional acoustic resonator and resonators with piezoelectric layers formed directly on intervening seed layers, according to a representative embodiment.

In particular, rocking curve studies were performed to test the effectiveness of a second seed layer (e.g., second seed layer 233) in improving c-axis orientation within a piezoelectric layer formed on the second seed layer. Generally, a rocking curve x-ray characterization gradually tilts the sample acoustic transducer about a main peak while the sample is exposed to x-rays. The more the c-axis of the crystals in the sample are oriented perpendicular to the surface of the second seed layer 233, the sharper and more narrow is the peak.

Referring to FIG. 5, curve 510 depicts a rocking curve examination of a conventional acoustic resonator, such as an FBAR included in a filter or other transducer device, with a first seed layer (e.g., first seed layer 231), no second seed layer. In the experiment producing curve 510, the acoustic resonator included a first seed layer formed of AlN having a thickness of about 30 nm, a first electrode formed of W having a thickness of about 250 nm and a piezoelectric layer formed of ZnO having a thickness of about 500 nm. As shown by the curve 510, the conventional acoustic resonator has a rocking curve full width at half maximum (FWHM) value of about 7.39 degrees.

In comparison, curves 520 and 530 depict rocking curve examinations of acoustic resonators, such as FBARs included in filters or other transducer devices, with second seed layers, in accordance with representative embodiments. In particular, the experiment producing curve 520 was performed on an acoustic resonator having a first seed layer formed of AlN at a thickness of about 30 nm, a first electrode formed of W having a thickness of about 250 nm, a second seed layer formed of AlN having a thickness of about 50 nm and a piezoelectric layer formed of ZnO having a thickness of about 500 nm. As shown by the curve 520, the acoustic resonator has a rocking curve FWHM value of about 2.36 degrees. Similarly, the experiment producing curve 530 was performed on an acoustic resonator having a first seed layer formed of AlN at a thickness of about 30 nm, a first electrode formed of W having a thickness of about 250 nm, a second seed layer formed of AlN having a thickness of about 30 nm and a piezoelectric layer formed of ZnO having a thickness of about 500 nm. As shown by the curve 530, the acoustic resonator has a rocking curve FWHM value of about 2.12 degrees.

The improved orientation of the crystals in the piezoelectric layer, in accordance with representative embodiments, likewise improves the coupling coefficient of the transducer device that includes the acoustic resonator. For example, the illustrative acoustic resonators that produced curves 510, 520 and 530 shown in FIG. 5 were incorporated into corresponding transducer devices. The intrinsic coupling coefficient $Kt^2$ of the transducer devices with corresponding curves 520 and 530 was extracted to be about 7.8 percent for each. In comparison, the intrinsic coupling coefficient $Kt^2$ of the (conventional) transducer device with corresponding curve 510 was extracted to be only about 5.5 percent.

Figure 6:
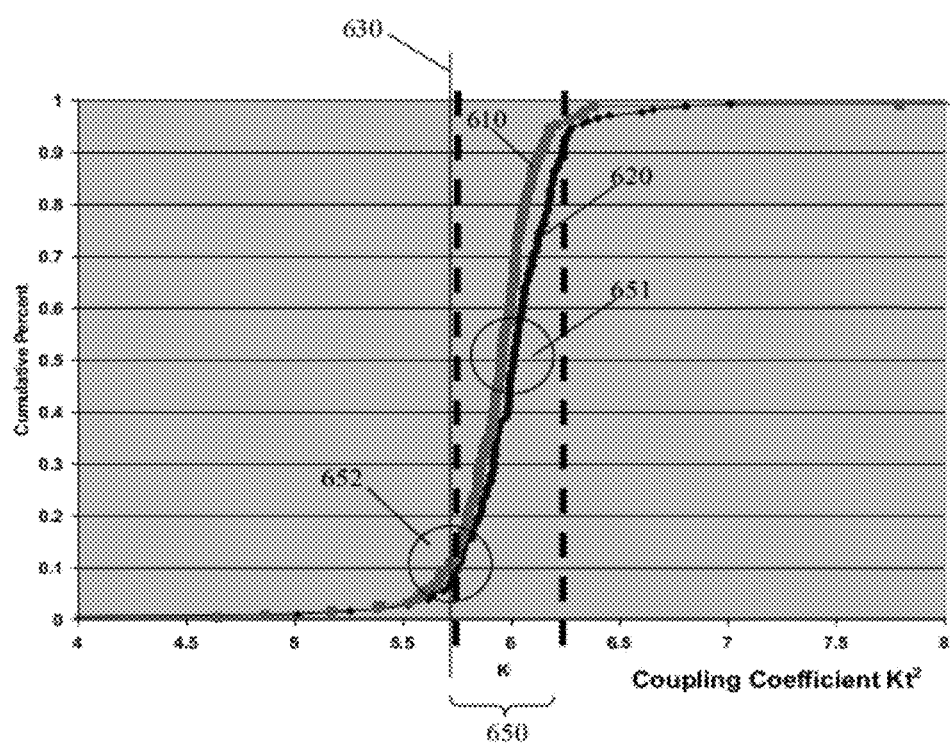
FIG. 6 is a graph illustrating performance characteristics of transducer devices including resonators with piezoelectric layers formed directly on intervening seed layers, according to a repetitive embodiment.

FIG. 6 is a graph illustrating performance characteristics of transducer devices including resonators with piezoelectric layers formed directly on intervening seed layers, according to a repetitive embodiment.

Referring to FIG. 6, curve 610 depicts a coupling coefficient curve of a transducer device including an acoustic resonator, such as an FBAR included in a filter or the like. In the depicted example, the acoustic resonator has a first seed layer formed of AlN at a thickness of about 30 nm, a first electrode formed of W having a thickness of about 800 nm, a second seed layer formed of AlN having a thickness of about 30 nm and a piezoelectric layer formed of ZnO having a thickness of about 800 nm. Curve 610 depicts a coupling coefficient curve of a transducer device including an acoustic resonator, such as an FBAR included in a filter or the like. In the depicted example, the acoustic resonator includes a first seed layer formed of AlN having a thickness of about 30 nm, a first electrode formed of W having a thickness of about 800 nm, a second seed layer formed of AlN having a thickness of about 15 nm and a piezoelectric layer formed of ZnO having a thickness of about 800 nm. Vertical line 630 indicates the value of the coupling coefficient $Kt^2$ necessary for operation of the transducer device.

Window 650, indicated by a pair of vertical dashed lines, shows the 80 percent range of the coupling coefficient $Kt^2$ distribution. Comparison of the curves 610 and 620 indicates a slightly better coupling coefficient $Kt^2$ for the 15 nm AlN second seed layer over the 30 nm AlN second seed layer, although the characteristics are similar. For example, the effective medium of the coupling coefficients $Kt^2$ corresponding to each of the curves 610 and 620 is about 6 percent, indicated by circle 651. Also, the tenth percentile of the coupling coefficients $Kt^2$ corresponding to each of the curves 610 and 620 has about 5.75 percent effective coupling coefficient $Kt^2$, indicated by circle 652. Thus, 80 percent of the distribution of the effective coupling coefficient $Kt^2$ is encompassed in about a ±5 percent window (window 650) around the medium shown by circle 652. Also, approximately 80 percent of the transducer devices having acoustic resonators formed in accordance with the representative embodiments meet the minimum coupling coefficient requirement, as compared to only about 20 percent of the transducer devices having conventionally formed acoustic resonators.

Thus, in the examples depicted in FIGS. 5 and 6, indicating transducer devices having acoustic resonators formed in accordance with the various embodiments, the addition of the interlayer or intervening seed layer (e.g., the second seed layer 233 in FIG. 2) results in an FWHM of about 2 percent and an effective coupling coefficient median of about 6 percent with a spread on wafer ($10^{th}$ to $90^{th}$ percentile in CP plot) of about ±5 percent, and about 80 percent of the transducer devices meet minimum device specifications. In comparison, the transducer device without the intervening seed layer has an FWHM of about 7 percent and an effective coupling coefficient median of about 5 percent with a spread on wafer of about ±40 percent, and only about 20 percent of the transducer devices meet minimum device specifications. The various embodiments thus provide a significant improvement over the conventional configuration.

Further, the improved quality of the piezoelectric layer according to the various embodiments (e.g., piezoelectric layer 234), due to the perpendicularly aligned crystals of the piezoelectric material (e.g., ZnO), enables reduction in the size of the die containing the transducer device (e.g., transducer device 200) to be about 30 percent to about 50 percent smaller than a die containing a conventionally formed transducer device, for example, used in cell band duplexers and the like. The reduction in size results in lower costs and higher integration of the electronic device in which the die is incorporated.

Figure 7:
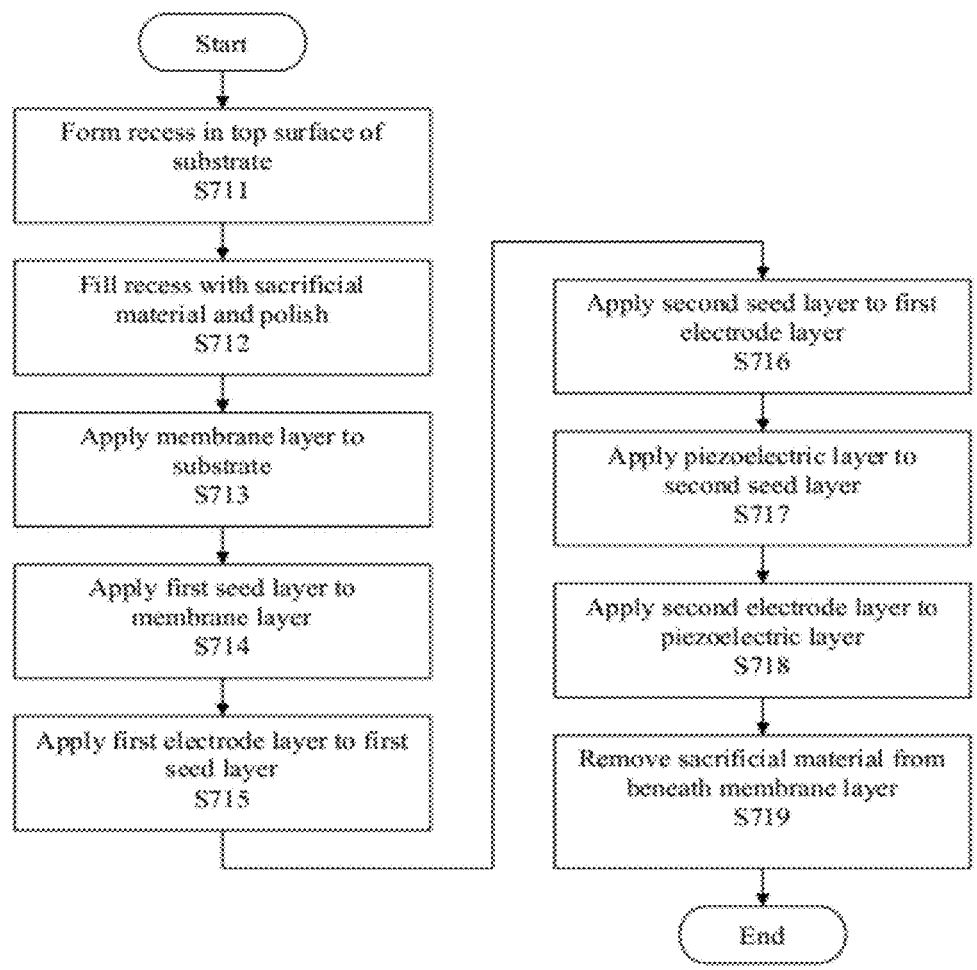
FIG. 7 is a flow diagram illustrating a process of forming a transducer device, according to another representative embodiment.

FIG. 7 is a flow diagram illustrating a method of fabricating a transducer device, according to another representative embodiment. FIGS. 8A-8G are cross-sectional diagrams illustrating the steps of the fabrication process of a transducer device, substantially corresponding to the operations depicted in FIG. 7, according to a representative embodiment. More particularly, FIG. 7 and FIGS. 8A-8G illustrate a method of fabricating transducer device 800 (e.g., shown in FIG. 8G), which does not include an acoustic reflector, according to a representative embodiment.

Figure 8A:
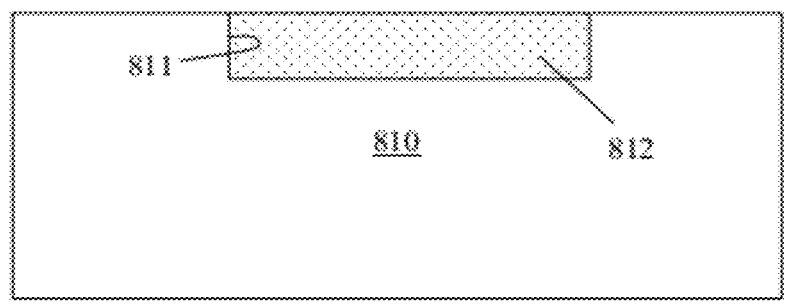
FIGS. 8A-8G are cross-sectional diagrams illustrating steps in a fabrication process of a transducer device, according to another representative embodiment.

In step S711 of FIG. 7, a "swimming pool" or recess 811 is formed in a top surface of substrate 810, as shown in FIG. 8A, by machining or by chemically etching the substrate 810 using photolithography, although various alternative techniques may be incorporated. The substrate 810 may be formed of Si, GaAs, InP, glass, sapphire or alumina, for example, although any of a variety of materials compatible with semiconductor processes may be incorporated. In an embodiment, the recess 811 may be about 2 µm to about 3

µm deep, for example. The recess is filled with a sacrificial material 812 in step S712, such as a phosphosilicate glass (PSG) film, for example. A chemical mechanical polish (CMP) may be performed to create a planar top surface.

Figure 8B:
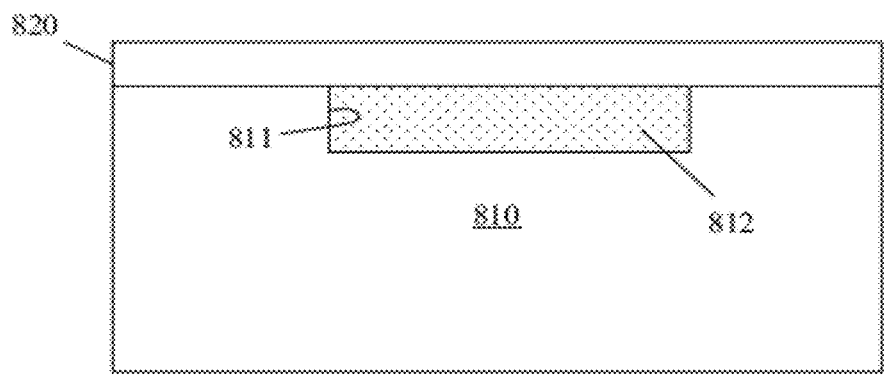
Figure 8C:
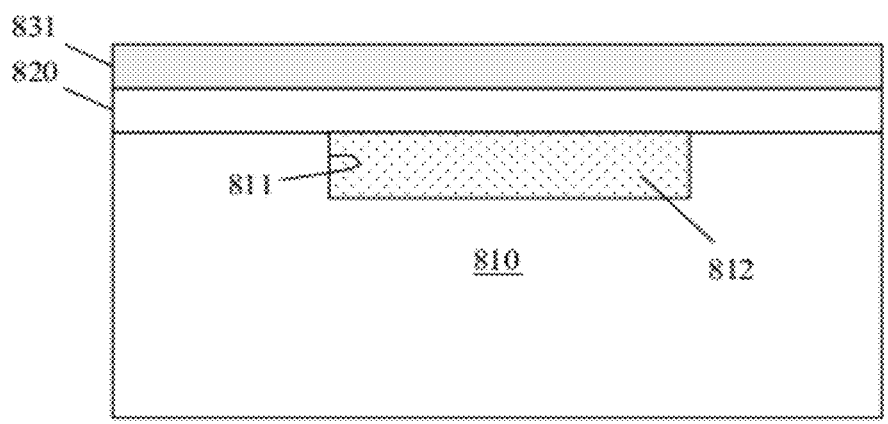
Figure 8D:
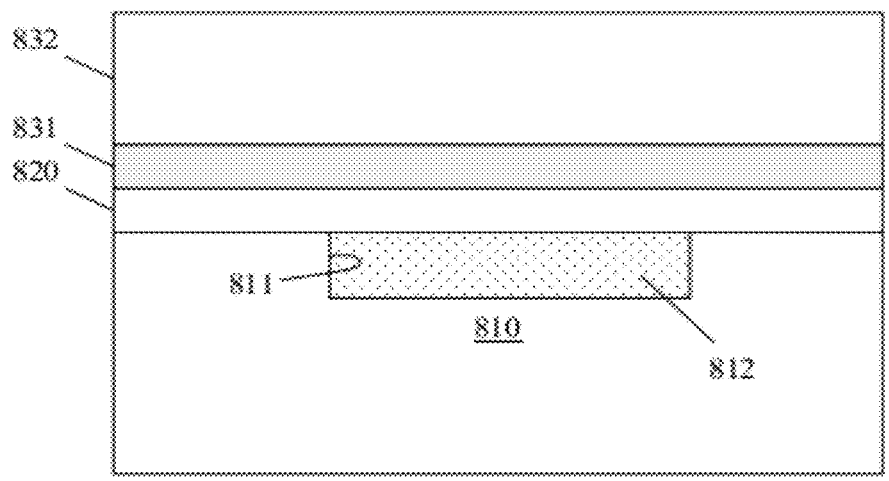
Figure 8E:
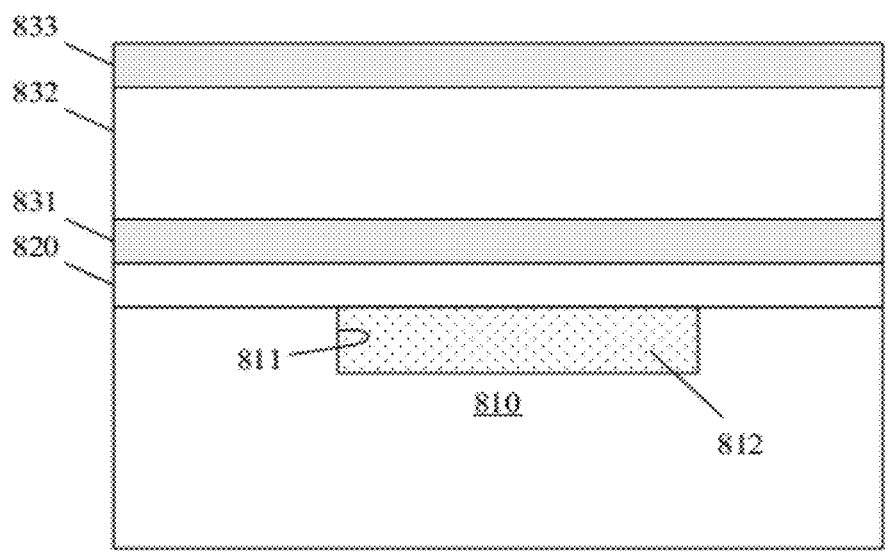
Figure 8F:
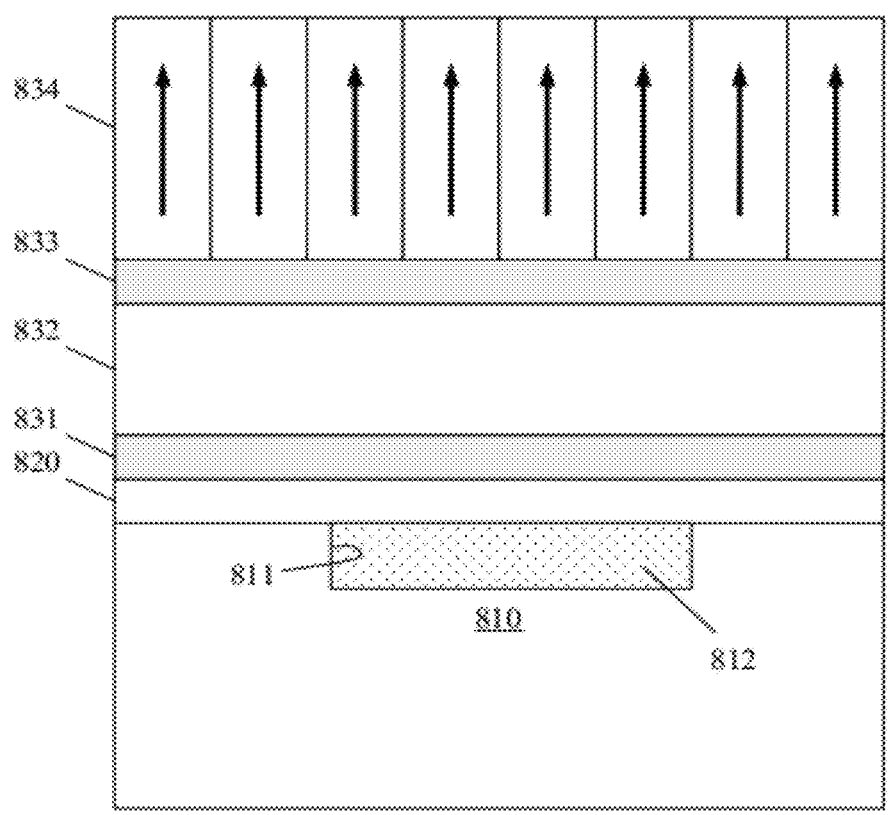

In step S713, membrane layer 820 is formed on the top surfaces of the substrate 810 and the sacrificial material 812, as shown in FIG. 8B. The membrane layer 820 may be applied using CVD, spin-on, sputtering, or evaporation techniques, for example. The membrane layer 820 may be formed of various materials compatible with semiconductor processes, such as BSG, SiO2, SiN, polysilicon, AlN, or the like. The thickness of the membrane layer 820 may range from about 0.05 µm to about 20 µm, for example.

In steps S714-S718, acoustic resonator 830 is formed on the membrane layer 820, as shown in FIGS. 8C-8G, respectively. That is, first seed layer 831 is formed on the membrane layer 820; first electrode layer 832 is formed on the first seed layer 831; second seed layer 833 is formed on the first electrode layer 232; piezoelectric layer 834 is formed on the second seed layer 833; and second electrode layer 835 is formed on the piezoelectric layer 834. The processes and materials for forming these layers in steps S714-S718 of FIG. 7 are substantially the same as discussed above with respect to forming the first seed layer 231, the first electrode layer 232, the second seed layer 233, the piezoelectric layer 234 and the second electrode layer 235 discussed above with respect to steps S312-S316 of FIG. 3, and therefore will not be repeated. In an alternative embodiment, the acoustic resonator 830 is formed directly on the top surface of the substrate 810 over the sacrificial material 812 (with no membrane layer 820).

In the depicted embodiment, the resonator stack 830 is shown as a solid resonator. However, in various embodiments, the resonator stack 830 may be an annular resonator, defining an opening extending from the top of the second electrode layer 835 to the top surface of the membrane layer 820. The annular resonator stack 830 may be substantially circular in shape, for example, although it may be formed in different shapes, such as ovals, squares, rectangles, or the like, without departing from the scope of the present teachings. The resonator stack 830 is substantially centered over the recess 812, enabling mechanical movement of the membrane layer 820 and/or the resonator stack 830. Application of a time-dependent voltage to the resonator stack 830 causes a mechanical wave to be launched through the resonator stack 830 and the membrane layer 820. Generally, as the piezoelectric layer 834 of the resonator stack 830 and/or the membrane layer 820 oscillate in response to a mechanical perturbation (e.g., sound waves), forces generated by the perturbation induce stresses in the piezoelectric layer 834 resulting in generation of a voltage difference across the first and second electrode formed from first and second electrode layers 831 and 832.

Figure 8G:
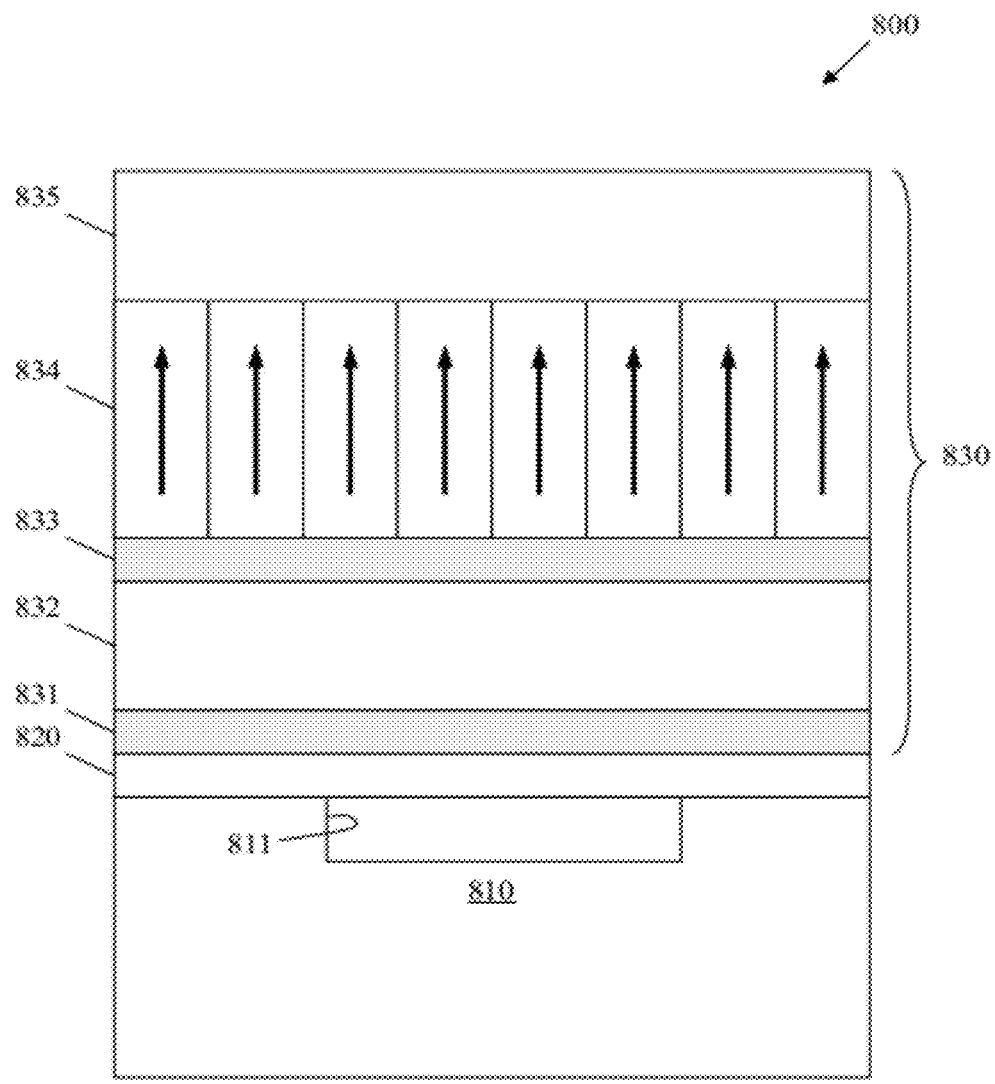

In step S719, the sacrificial material 812 is removed from beneath the membrane layer 820, leaving the membrane layer 820 and the resonator stack 830 suspended over a now empty recess 811, also as shown in FIG. 8G. For example, if the sacrificial material is PSG, the entire device may be submerged in an aqueous hydrofluoric (HF) acid solution, and the sacrificial material 812 is etched through release holes (not shown) on the front and/or back sides of the substrate 210, thus providing transducer device 800. Further examples of forming a resonator stack over a recess in a substrate are described by GRANNEN et al. in U.S. Pat. No. 7,345,410, filed Mar. 22, 2006, which is hereby incorporated by reference.

In an alternative embodiment, no recess is formed in the top surface of the substrate 810, in which case the membrane layer 820 and/or the resonator stack 830 (when the membrane layer 820 is not included) is simply formed on the top surface of the substrate 810. After formation of the resonator stack 830, a photoresist pattern or etch mask is deposited on the bottom surface of the substrate 810. The etch mask includes a hole that substantially aligns with the resonator stack 830, and may be formed by machining or by chemically etching a mask layer (not shown), previously applied to the substrate 810, using photolithography, although various alternative techniques may be incorporated.

Then, an etching process is performed to form a cavity through the hole in the etch mask to expose corresponding portions of the bottom surface of the membrane layer 820 (or the first seed layer 831, if no membrane layer 820 is applied). The etching process may include any dry or liquid etching process compatible with semiconductor fabrication processes for the respective materials. For example, Si may be etched in aqueous potassium hydroxide (KOH) or tetramethyl ammonium hydroxide (TMAH), or may be dry etched in fluorine containing gas plasmas. $SiO_2$ may be etched in aqueous HF solutions or chlorine based dry etch solutions, and PECVD SiN may be etched in aqueous HF. Also, reactive ion etching (RIE) may be used for etching BSG, and RIE or phosphoric acid based wet etching may be used for SiN, although other types of etching may be incorporated without departing from the scope of the present teachings.

The etch mask may then be chemically released or etched. For example, if the etch mask 845 is a photoresist, it may be removed by application of a solvent, such as N-methyl pyrrolidone (NMP), or by an oxygen gas plasma, for example. If the etch mask is a hard mask, meaning it is not made of photoresist material, it may be removed using a wet or dry chemical etch process. Transducer device 800 is thus formed, using a second seed layer 833 on which the piezoelectric layer 834 is directly formed. Further examples of forming a resonator are described by MARTIN et al. in U.S. patent application Ser. No. 12/495,443, filed Jun. 30, 2009, which is hereby incorporated by reference.

Of course, if the transducer device 800 is formed as part of a wafer, the transducer device 800 may be singulated into a corresponding die following formation of the cavity 815, using any separation technique compatible with semiconductor fabrication processes, such as scribe and break, mechanical or laser sawing, or the like.

As a result of the fabrication process, the transducer device 800 includes piezoelectric layer 834 having a highly uniform orientation of crystals of the piezoelectric material along the c-axis. In other words, the c-axis orientation of the grains is substantially aligned with one another and substantially perpendicular to the growth surface, which is the top surface of the second seed layer 833 in the depicted example. Accordingly, the piezoelectric layer 834 is produced with a high degree of c-axis orientation uniformity in a direction substantially perpendicular to the top surface of the second seed layer 833. By placing the second seed layer 833 on the first electrode 831 substrate before the deposition of the piezoelectric material, the improved c-axis orientation of the piezoelectric layer 834 is enabled.

Notably, the teachings of the incorporated patents and patent applications are intended to be illustrative of methods, materials and structures useful to the present teachings, but in no way limiting to the present teachings. The various components, materials, structures and parameters are included by way of illustration and example only and not in any limiting sense. In view of this disclosure, those skilled in the art can implement the present teachings in determining their own applications and needed components, materials, structures and equipment to implement these applications, while remaining within the scope of the appended claims.

The invention claimed is:

1. A method of forming an acoustic resonator, the method comprising:
   forming a seed layer on a first electrode layer;
   forming a piezoelectric layer directly on a surface of the seed layer, the piezoelectric layer comprising a plurality of crystals, wherein the seed layer causes the plurality of crystals to grow with corresponding crystal axis orientations substantially perpendicular to and in a direction away from the surface of the seed layer, and each said crystal axis orientation is substantially aligned with one another; and
   forming a second electrode layer on the piezoelectric layer.

2. The method of claim 1, wherein the substantially perpendicular crystal axis orientations of the plurality of crystals of the piezoelectric layer maximize a coupling coefficient of the acoustic resonator.

3. The method of claim 1, wherein the seed layer comprises aluminum nitride (AlN).

4. The method of claim 3, wherein the piezoelectric layer comprises zinc oxide (ZnO).

5. The method of claim 4, wherein the seed layer is formed to a thickness of about 10 nm to about 100 nm.

6. The method of claim 4, wherein the seed layer is formed to a thickness of about 10 nm to about 30 nm.

7. A method of forming an acoustic transducer device, the method comprising:
   forming a first seed layer on a semiconductor substrate;
   forming a first electrode layer directly on the first seed layer;
   forming a second seed layer on the first electrode layer;
   forming a piezoelectric layer directly on the second seed layer, the piezoelectric layer comprising a plurality of crystals of piezoelectric material, wherein the second seed layer comprises a material that causes of the plurality of crystals to grow with c-axis orientations substantially perpendicular to and in a direction away from a top surface of the second seed layer and each said c-axis orientation is substantially aligned with one another; and
   forming a second electrode layer on the piezoelectric layer.

8. The method of claim 7, further comprising:
   forming an acoustic mirror on the semiconductor substrate, wherein the first seed layer is formed directly on a surface of the acoustic mirror.

9. The method of claim 8, wherein the acoustic mirror comprises a Bragg reflector.

10. A method of forming an acoustic resonator, the method comprising:
    forming a seed layer on a first electrode layer;
    forming a piezoelectric layer directly on a surface of the seed layer, the piezoelectric layer comprising a piezoelectric material including a plurality of crystals, wherein the seed layer causes the plurality of crystals to grow with corresponding c-axes oriented substantially perpendicular to and in a direction away from the surface of the seed layer, and each said c-axis is substantially aligned with one another; and
    forming a second electrode layer on the piezoelectric layer.

11. The method of claim 10, wherein the substantially perpendicular crystal axis orientations of the plurality of crystals of the piezoelectric layer maximize a coupling coefficient of the acoustic resonator.

12. The method of claim 10, wherein the piezoelectric layer comprises zinc oxide (ZnO).

13. The method of claim 12, wherein the seed layer comprises aluminum nitride (AlN).

14. The method of claim 13, wherein the seed layer is formed to a thickness of about 10 nm to about 100 nm.

15. The method of claim 13, wherein the seed layer is formed to a thickness of about 10 nm to about 30 nm.

* * * * *